United States Patent
Mei et al.

(10) Patent No.: US 6,844,214 B1
(45) Date of Patent: Jan. 18, 2005

(54) MICROELECTROMECHANICAL SYSTEM BASED SENSORS, SENSOR ARRAYS, SENSING SYSTEMS, SENSING METHODS AND METHODS OF FABRICATION

(75) Inventors: Ping Mei, Palo Alto, CA (US); Decai Sun, Los Altos, CA (US); Robert A. Street, Palo Alto, CA (US)

(73) Assignee: Xerox, Corporation, Stamford, CT (US)

( * ) Notice: Subject to any disclaimer, the term of this patent is extended or adjusted under 35 U.S.C. 154(b) by 0 days.

(21) Appl. No.: 10/604,850

(22) Filed: Aug. 21, 2003

(51) Int. Cl.$^7$ ............... H01L 21/00; H01L 23/48; H01R 11/22
(52) U.S. Cl. ............... 438/52; 438/26; 438/29; 438/30; 438/50; 438/57; 257/773; 257/776; 257/775; 257/625; 257/419; 439/852; 439/856; 439/81; 439/82
(58) Field of Search ............... 257/419, 625, 257/773, 776, 735, 415; 439/81, 88, 852, 856; 438/52, 26, 27, 28, 29, 30, 31, 50, 117, 611, 666, 678, 751, 57

(56) References Cited

U.S. PATENT DOCUMENTS

| | | |
|---|---|---|
| 5,848,685 A | 12/1998 | Smith et al. |
| 5,914,218 A | 6/1999 | Smith et al. |
| 5,944,537 A | 8/1999 | Smith et al. |
| 6,184,065 B1 | 2/2001 | Smith et al. |
| 6,184,699 B1 | 2/2001 | Smith et al. |
| 6,213,789 B1 | 4/2001 | Chua et al. |
| 6,264,477 B1 | 7/2001 | Smith et al. |
| 6,267,605 B1 * | 7/2001 | Biegelsen .................. 439/81 |
| 6,290,510 B1 | 9/2001 | Fork et al. |
| 6,292,208 B1 | 9/2001 | Lofhus et al. |
| 6,300,706 B1 * | 10/2001 | Grudkowski et al. ....... 310/334 |
| 6,339,289 B1 | 1/2002 | Fork |
| 6,361,331 B2 | 3/2002 | Fork et al. |
| 6,392,524 B1 | 5/2002 | Biegelsen et al. |
| 6,396,677 B1 * | 5/2002 | Chua et al. ................. 361/278 |
| 6,411,427 B1 | 6/2002 | Peeters et al. |
| 6,429,417 B1 * | 8/2002 | Street et al. ............. 250/214.1 |
| 6,439,898 B2 | 8/2002 | Chua et al. |
| 6,504,643 B1 | 1/2003 | Peeters et al. |
| 6,534,249 B2 | 3/2003 | Fork et al. |
| 6,636,653 B2 * | 10/2003 | Miracky et al. ............. 385/14 |

* cited by examiner

*Primary Examiner*—Matthew Smith
*Assistant Examiner*—Igwe U. Anya
(74) *Attorney, Agent, or Firm*—Oliff & Berridge, PLC

(57) ABSTRACT

A microelectromechanical system (MEMS) based sensor comprises: a substrate defining a plane; a first conductive material layer having a first stress, a first portion of the first conductive material layer being connected to the substrate and extending in a substantially parallel direction to the plane defined by the substrate and a second portion being disconnected from the substrate and extending in a substantially non-parallel direction to the plane defined by the substrate; and a sensor material layer formed over at least the second portion of the first conductive material layer, the sensor material layer having a second stress that is less than the first stress of the first conductive material layer. The stresses form a stress gradient that bends the second portion of the first conductive material layer and the sensor material layer formed over the second portion of the first conductive material layer away from the substrate.

43 Claims, 20 Drawing Sheets

MICROELECTROMECHANICAL SYSTEM BASED SENSORS, SENSOR ARRAYS, SENSING SYSTEMS, SENSING METHODS AND METHODS OF FABRICATION

BACKGROUND OF THE INVENTION

1. Field of Invention

This invention relates to microelectromechanical system (MEMS) based structures and microelectromechanical system (MEMS) based systems including at least one sensor.

This invention also relates to methods for fabricating such structures and systems, as well as methods for sensing using such microelectromechanical system based systems.

2. Description of Related Art

Conventional sensor arrays that allow communication between integrated circuit chips are built into chips parallel to the substrate. For example, a typical free-space chip-to-chip optical interconnect may be based on two-dimensional CMOS imaging arrays and surface-emitting laser arrays. The two-dimensional CMOS imaging arrays are flip-chip bonded onto a semiconductor chip. The surface-emitting laser arrays are flip-chip bonded onto a separate semiconductor chip. The two-dimensional CMOS imaging arrays are then aligned with the surface-emitting laser arrays by vertically stacking the chips.

Planar chip-to-chip communication may be achieved by mounting the two-dimensional CMOS imaging arrays sideways onto the semiconductor chip. The surface-emitting laser arrays are replaced with either edgeemitting laser arrays or optical microelectromechanical system (MEMS) scanners. This arrangement allows for optical communication between chips that are coplanar, for example, arranged on a common back plate.

SUMMARY OF THE INVENTION

The conventional sensor arrays for chip-to-chip communication have various limitations and drawbacks. For example, the free-space chip-to-chip optical interconnect based on two-dimensional CMOS imaging arrays and surface-emitting laser arrays is limited to vertically stacked chips. Further, the assembly process of side-mounted imaging arrays is costly and has low reliability. This invention avoids these and other drawbacks associated with conventional sensor arrays.

The systems and methods according to this invention provide a micromachined sensor that is erected and integrated on a semiconductor chip.

The systems and methods according to this invention separately provide improved flexibility in the design of an optical communication system for semiconductor chips.

The systems and methods according to this invention separately provide reduced fabrication costs of a sensor or sensor array for a semiconductor chip.

The systems and methods according to this invention separately provide improved manufacturability of a sensor or sensor array for a semiconductor chip.

The systems and methods according to this invention separately provide increased reliability of a sensor or sensor array for a semiconductor chip.

The systems and methods according to this invention separately provide chip-to-chip communication with improved robustness and/or reliability.

The systems and methods according to this invention separately provide planar chip-to-chip communication.

The systems and methods according to this invention separately provide in-line calibration for an optical communication system.

The systems and methods according to this invention separately provide a micro-optical bench having a sensor or sensor array.

The systems and methods according to this invention separately provide improved fabrication of an erected micromachined structure.

The systems and methods according to this invention separately provide laser-enhanced fabrication of an erected micromachined structure.

In various exemplary embodiments according to the systems and methods of this invention, a microelectromechanical system (MEMS) based sensor comprises a substrate defining a plane, a first conductive material layer having a first stress and a sensor material layer formed over at least the second portion of the first conductive material layer. A first portion of the first conductive material layer is connected to the substrate and extends in a substantially parallel direction to the plane defined by the substrate. A second portion of the first conductive material layer is disconnected from the substrate and extends in a substantially non-parallel direction to the plane defined by the substrate. The sensor material layer has a second stress that is less than the first stress of the first conductive material layer. The first and second stresses form a stress gradient that bends the second portion of the first conductive material layer and the sensor material layer formed over the second portion of the first conductive material layer away from the substrate.

In various embodiments, the sensor further comprises a second conductive material layer formed over the sensor material layer. The second conductive material layer may have a third stress that is less than the second stress of the sensor material layer, such that the first, second and third stresses form a stress gradient that bends the second portion of the first conductive material layer, the sensor material layer formed over the second portion of the first conductive material layer and at least a portion of the second conductive material layer away from the substrate.

In various exemplary embodiments, the sensor material layer comprises a silicon material. In various exemplary embodiments, the silicon material comprises amorphous silicon. In various exemplary embodiments, the amorphous silicon comprises hydrogenated amorphous silicon.

In various exemplary embodiments, the sensor material layer comprises a Group III-V semiconductor material. In various exemplary embodiments, the Group III-V semiconductor material comprises gallium-arsenide.

In various exemplary embodiments, the first conductive material layer comprises a titanium-tungsten material.

In various exemplary embodiments, the first and second stresses are compressive stresses. In various exemplary embodiments, the third stress is a tensile stress.

In various exemplary embodiments, the second conductive material layer comprises molybdenum-chromium.

In various exemplary embodiments, a sub-layer of the sensor material layer that is remote from the first conductive material layer has a reduced stress that is less than the second stress.

In various exemplary embodiments, a method of fabricating a microelectromechanical system (MEMS) based sensor, comprises forming a substrate that defines a plane, forming a first conductive material layer having a first stress, forming a sensor material layer over at least a second portion of the first conductive material layer and disconnecting the second portion of the first conductive material layer from the substrate. At least a first portion of the first conductive material layer is connected to the substrate and extends in a substantially parallel direction to the plane defined by the substrate. The sensor material layer has a second stress that is less than the first stress of the first conductive material layer such that the first and second stresses form a stress gradient that, upon disconnecting the second portion of the first conductive material layer from the substrate, bends the second portion of the first conductive material layer and the sensor material layer formed over the second portion of the first conductive material layer away from the substrate to extend in a substantially non-parallel direction to the plane defined by the substrate.

In various exemplary embodiments, the method further comprises forming a second conductive material layer over the sensor material layer. The second conductive material layer may have a third stress that is less than the second stress of the sensor material layer, such that the first, second and third stresses form a stress gradient that bends the second portion of the first conductive material layer, the sensor material layer formed over the second portion of the first conductive material layer and at least a portion of the second conductive material layer away from the substrate.

In various exemplary embodiments, the method further comprises forming a reduced-stress sub-layer of the sensor material layer remote from the first conductive material layer. The reduced stress sub-layer having a stress that is less than the second stress. In various exemplary embodiments, forming the reduced-stress sub-layer comprises crystallizing part of the sensor material layer. In various exemplary embodiments, the method further comprises subjecting the sensor material layer to a hydrogen plasma treatment after crystallizing part of the sensor material layer. In various exemplary embodiments, forming the sensor material layer comprises forming a silicon layer and crystallizing part of the sensor material layer comprises forming a polysilicon layer.

In various exemplary embodiments, forming the reduced-stress sub-layer comprises irradiating part of the sensor material layer with laser light. In various exemplary embodiments, the method further comprises subjecting the sensor material layer to a hydrogen plasma treatment after irradiating part of the sensor material layer with laser light. In various exemplary embodiments, irradiating part of the sensor material layer with laser light comprises irradiating with excimer laser light. In various exemplary embodiments, irradiating with excimer laser light comprises pulsing the excimer laser light.

In various exemplary embodiments, a chip-to-chip communication system comprises a first semiconductor chip having at least one of an optical scanner and a laser array and a:second semiconductor chip having an array of microelectromechanical system based sensors, wherein the array of sensors is aligned with the at least one of the optical scanner and the laser array. In various exemplary embodiments, the system further comprises a back plate having a planar surface on which the first and second semiconductor chips are mounted. In various exemplary embodiments, the back plate comprises a printed circuit board. In various exemplary embodiments, the first semiconductor chip and the second semiconductor chip are part of a flat panel display system.

In various exemplary embodiments, the first semiconductor chip has a laser array and a collimation lens array associated with the laser array. In various exemplary embodiments, the first semiconductor chip has a laser array comprising an edge emitting laser array. In other various exemplary embodiments, the first semiconductor chip has a laser array comprising an VCSEL laser array.

In various exemplary embodiments, a chip-to-chip communication method comprises emitting an optical signal from a first semiconductor chip using at least one of an optical scanner and a laser array and receiving the emitted optical signal at a second semiconductor chip using an array of microelectromechanical system based sensors that is aligned with the at least one of the optical scanner and the laser array.

In various exemplary embodiments, a method of in-line calibration of an optical link comprises disposing a microelectromechanical system based sensor in an optical path of an optical signal carrier and sensing at least a portion of an optical signal carried by the optical signal carrier.

In various exemplary embodiments, a micro-optical bench comprises a bench surface and at least one microelectromechanical system based sensor integrated with the bench surface.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention described in detail below, with reference to the attached drawing figures, in which.

DETAILED DESCRIPTION OF EXEMPLARY EMBODIMENTS

Figure 1:
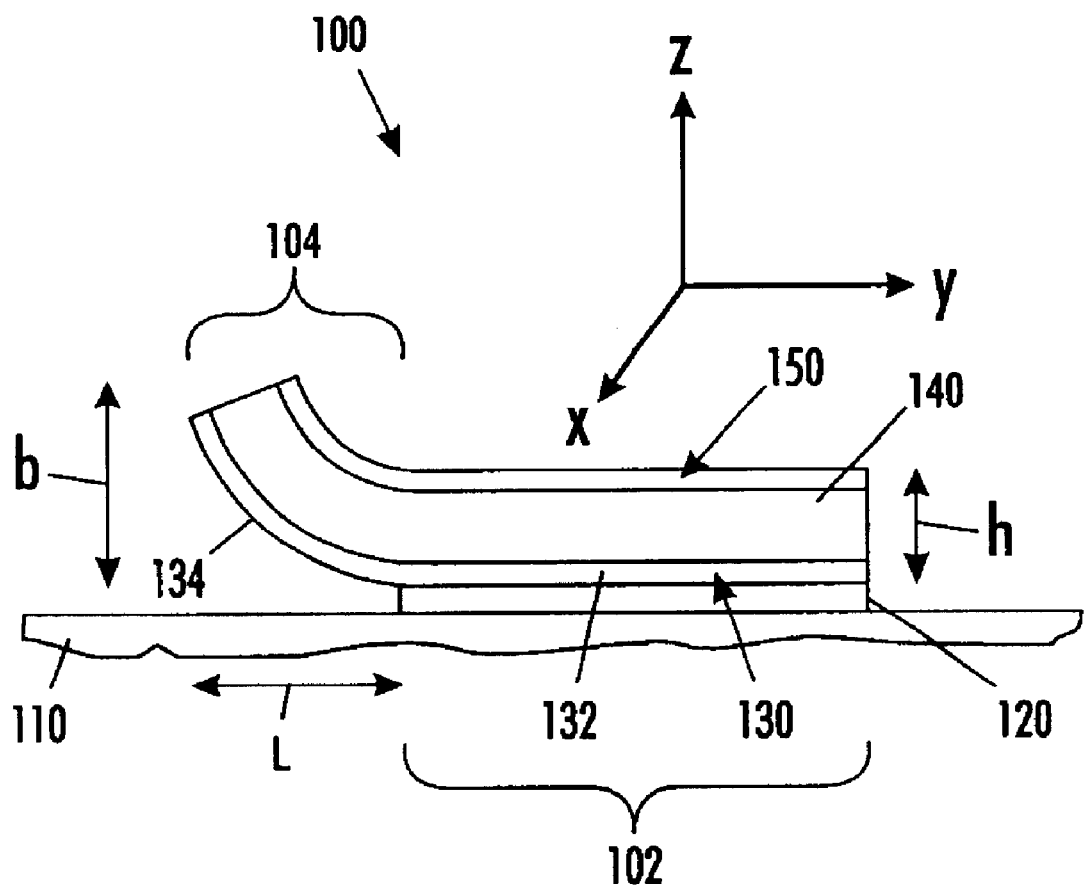
FIG. 1 is a cross sectional elevation view of a first exemplary embodiment of a microelectromechanical system (MEMS) based sensor according to this invention.

While the invention is described hereafter with reference to various systems that incorporate one or more sensors according to this invention, it should be understood that this invention is not strictly limited to such systems. Rather, any microelectromechanical system (MEMS) based system that utilizes a sensor is contemplated by this invention. The description is intended to convey the features of the invention without limiting the invention to the specific embodiments disclosed.

Furthermore, while various details of methods of fabricating a sensor according to this invention are described, it should be understood that this invention is not strictly limited to such methods. Rather, any known or hereafter developed microelectromechanical system (MEMS) based fabrication techniques may be used. For example, known techniques for forming stress-engineered or stress gradient-induced structures such as spring contacts, coils and/or suspension arms may be used. In particular, various suitable fabrication techniques are disclosed in U.S. Pat. Nos. 5,848,685, 5,914,218, 5,944,537, 6,184,065, 6,184,699 and 6,264,477 to Smith et al., U.S. Pat. Nos. 6,213,789 and 6,439,898 to Chua et al., U.S. Pat. Nos. 6,290,510, 6,361,331 and 6,534,249 to Fork et al., U.S. Pat. No. 6,392,524 to Biegelsen et al. and U.S. Pat. Nos. 6,411,427 and 6,504,643 to Peeters et al., each of which is incorporated herein by reference in its entirety. In general, known techniques common to the integrated circuit (IC) fabrication industry to manufacture microelectromechanical or micromechanical devices may be utilized to fabricate the sensors according to this invention as well as the systems with which the sensors may be integrated.

The systems and methods according to this invention provide a microelectromechanical system (MEMS) based sensor or sensor array. The sensors according to this invention may be referred to as "erected" sensors because the sensors extend away from the plane of the substrate of the semiconductor chip or other structure with which the sensors are integrated. In various exemplary embodiments, the sensors are realized by a stress gradient that is designed via a plurality of layers having different stresses. In various exemplary embodiments, the plurality of layers comprises one or more conductive material layers and at least one sensor material layer.

In various exemplary embodiments, the sensors according to this invention are integrated with a semiconductor chip, such as, for example, an optoelectronic chip. The erected geometry of the sensors according to this invention allow the semiconductor chip to receive a signal that is transmitted parallel to the semiconductor chip, i.e., parallel to a plane defined by a substrate of the chip. Thus, the sensors according to this invention may be integrated with semiconductor or optoelectronic chips to provide planar communication between chips.

In various exemplary embodiments according to this invention, the stress gradient generated by the different stresses of various layers may be enhanced by crystallizing part of the sensor material layer. For example, in various exemplary embodiments the stress gradient is enhanced by irradiation with a laser.

A cross sectional elevation view of a microelectromechanical system (MEMS) based sensor 100 according to a first exemplary embodiment of this invention is shown in FIG. 1. The sensor 100 is generally formed by a plurality of layers having different stresses such that a stress gradient in the z-direction is created.

As shown in FIG. 1, the sensor 100 has a first portion 102 that is connected to a substrate 110 and extends in the x- and/or y-directions substantially parallel to the x-y plane defined by the substrate 110. The sensor 100 has a second portion 104 that is disconnected from the substrate 110 and extends in a substantially non-parallel direction to the x-y plane defined by the substrate 110.

In the first exemplary embodiment, the sensor 100 has an interconnect layer 120 formed over the substrate 110. A first conductive material layer 130 having a first stress is formed over the interconnect layer 120 and a first portion 132 of the first conductive material layer 130 is connected to the substrate 110 via the interconnect layer 120. A second portion 134 of the first conductive material layer 130 is mechanically disconnected from the substrate 110.

A sensor material layer 140 having a second stress is formed over the first conductive material layer 130. The second stress of the sensor material layer 140 is less than the first stress of the first conductive material layer 130.

Thus, at least prior to removal of a sacrificial portion (not shown) of the interconnect layer 120, a stress gradient in the z-direction exists in the sensor 100. After the sacrificial portion (not shown) of the interconnect layer 120 is removed, as illustrated in FIG. 1, the stress gradient causes the second portion 104 of the sensor 100 to curl and extend in a substantially non-parallel direction to the x-y plane defined by the substrate 110. The curling of the second portion 104 of the sensor 100 releases at least some of the intrinsic stress created by the stress gradient.

The sensor 100 may also have a second conductive material layer 150 formed over the sensor material layer 140. The second conductive material layer 150 may have a third stress that is less than the second stress of the sensor material layer 140 such that the first, second and third stresses form a stress gradient in the z-direction in the sensor 100 at least prior to removal of a sacrificial portion (not shown) of the interconnect layer 120.

As illustrated in FIG. 1, the sensor 100 has a layer height h that is determined by the thickness of the layers of the sensor 100 other than the interconnect layer 120. The sensor 100 also has a lift height b that is determined by the stress gradient of the layers, the elastic modulus of the layers, the layer height h and the length L of the second portion 104 of the sensor 100. For example, if the stress gradient is uniform in the x-y plane, then the lift height is:

$$b \approx L^2 \Delta\sigma / 2hY' \qquad (1)$$

where $\Delta\sigma$ is the stress gradient or difference along the z-direction and $Y'$ is the biaxial elastic modulus.

The interconnect layer 120 may be of any suitable material that may be selectively removed without adversely affecting the other layers 130, 140, 150 and/or the substrate 110. For example, the material of the interconnect layer 120 may be selected to facilitate its removal by etching with an etchant that is highly selective between the material of the interconnect layer 120 and the materials of the other layers 130, 140, 150 and/or the substrate 110. In various exemplary embodiments, the interconnect layer 120 may be a metal such as aluminum for interconnecting the first conductive material layer 130 to circuitry of an integrated circuit formed on the substrate 110, for example, via electrical traces. Other materials may be used for the interconnect layer 120, such as, for example, low stress chrome or chrome-molybdenum alloy.

The first conductive material layer 130 and the second conductive material layer 150 may be of any suitable conductive material. For example, the first conductive material layer 130 may be a metal layer, such as a titanium-tungsten film. Other suitable materials may be used for the first conductive material layer. For example, if aluminum is used for the interconnect layer 120, then chrome may be used for the first conductive material layer 130, and vice versa. The second conductive material layer 150 may be, for example, an ITO (indium-tin-oxide) film.

The sensor material layer 140 may be of any suitable sensor material. For example, the sensor material layer 140 may be a silicon layer. For example, the sensor material layer 140 may be hydrogenated amorphous silicon, polycrystalline silicon, III-V compound materials or organic photo sensing materials.

FIGS. 2–9 illustrate various stages of a first exemplary embodiment of a method of fabricating an exemplary microelectromechanical system (MEMS) based sensor according to this invention. FIGS. 2, 4, 6 and 8 show a top view and FIGS. 3, 5, 7 and 9 show a corresponding cross sectional elevation view.

Figure 2:
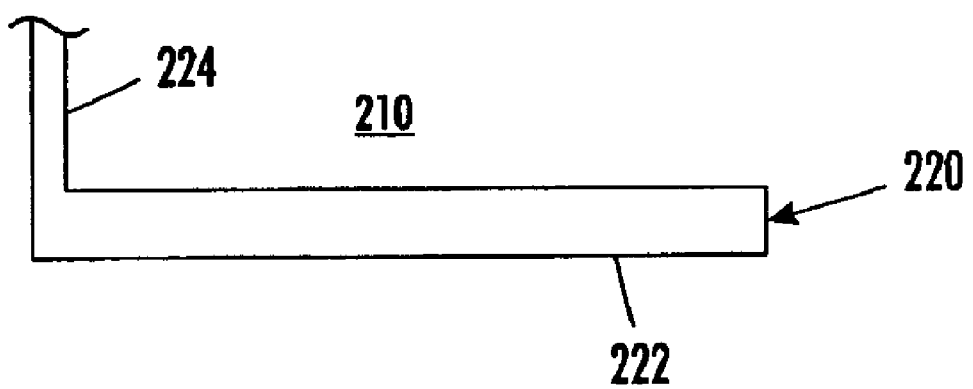
FIGS. 2–9 illustrate various stages of a first exemplary embodiment of a method of fabricating an exemplary microelectromechanical system (MEMS) based sensor according to this invention, FIGS. 2, 4, 6 and 8 showing a top view and FIGS. 3, 5, 7 and 9 showing a corresponding cross sectional elevation view.
Figure 3:
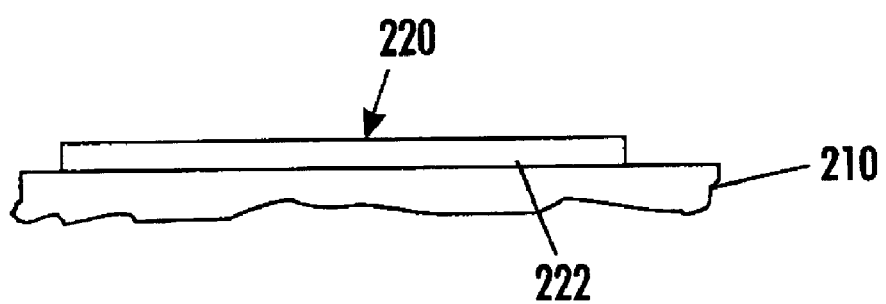

As illustrated in FIGS. 2 and 3, the exemplary fabrication process begins with a substrate 210 or a surface of a semiconductor chip or integrated circuit. An interconnect layer 220 is formed over a portion of the substrate 210.

For example, a relatively low compressive stress aluminum film may be formed by sputter deposition. Then, the film is patterned to create the interconnect layer 220 and a sacrificial layer 222 over which the sensor is to be formed. One or more connections 224, such as electrical traces, to sensor drivers, processing circuits and/or other circuitry formed on the substrate 210 may also be formed by patterning the aluminum film.

Figure 4:
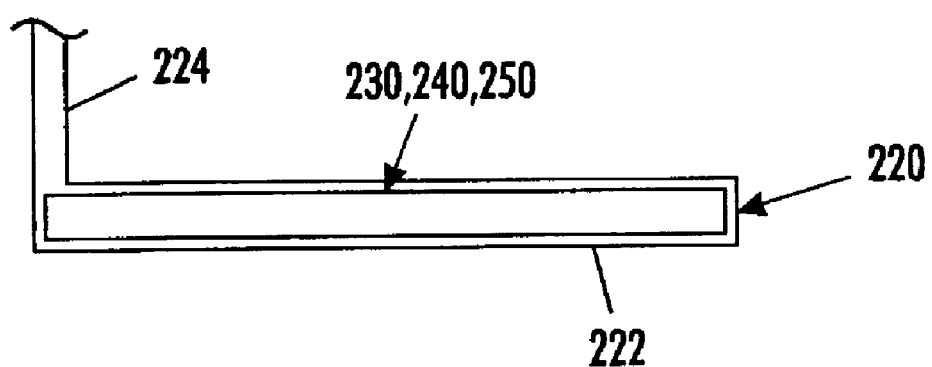
Figure 5:
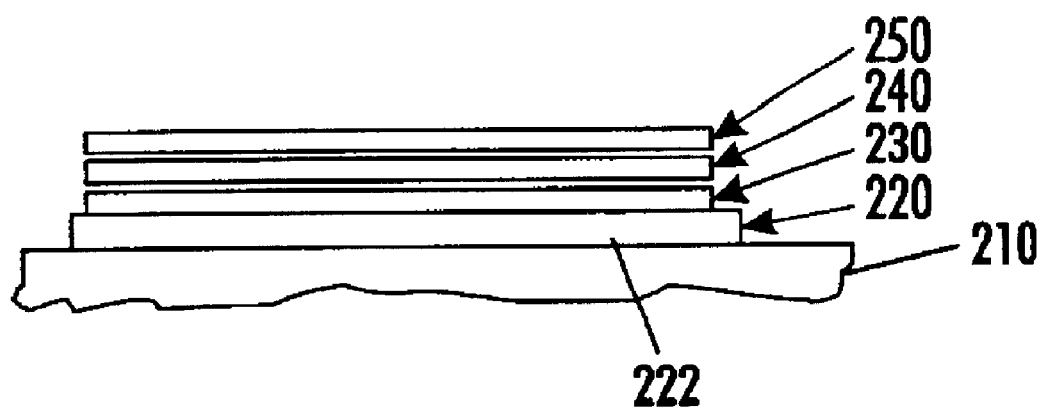

Next, as illustrated in FIGS. 4 and 5, a first conductive material layer 230, a sensor material layer 240 and a second conductive material layer 250 are consecutively formed, for example by consecutive depositions. In the exemplary embodiment shown, the first conductive material layer 230 is a relatively high compressive stress (~2 Gpa, for example) titanium-tungsten film, the sensor material layer 240 is a lower compressive stress (~700 Mpa, for example) hydrogenated amorphous silicon layer with p+, i and n+ sub-layers, and the second conductive material layer 250 is a relatively low tensile stress ITO layer. The first conductive material layer 230, the sensor material layer 240 and the second conductive material layer 250 are then patterned to form a structure over the interconnect layer 220 and the sacrificial layer 222.

Figure 6:
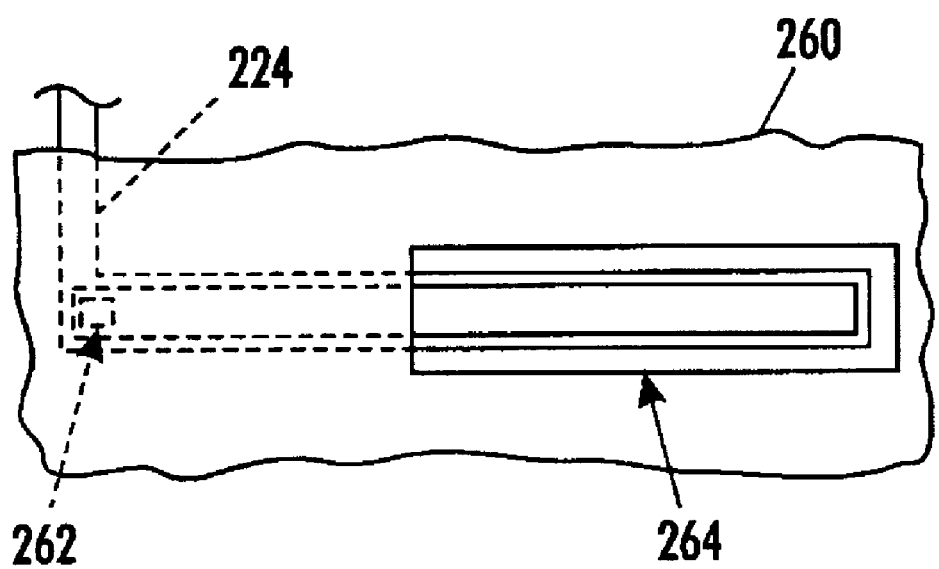
Figure 7:
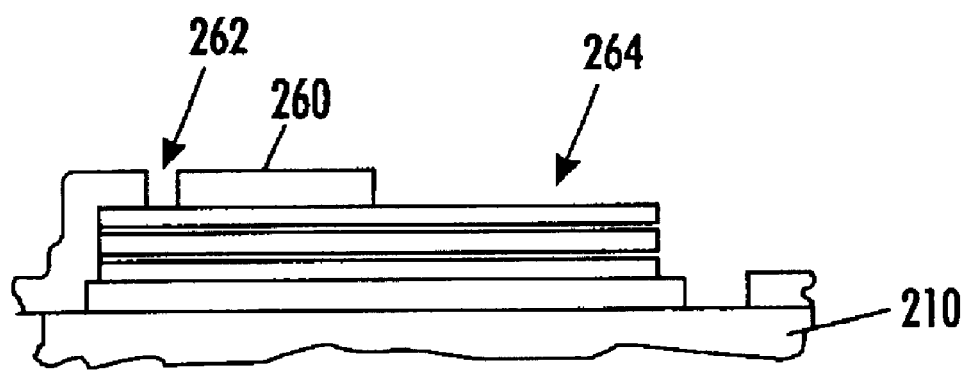

As illustrated in FIGS. 6 and 7, a passivation layer 260 may be formed over the various structures already deposited on the substrate 210. The passivation layer 260 may be of any suitable dielectric material. A via 262 may be formed through the passivation layer 260 to expose a portion of the second conductive material layer 250. Further, an opening 264 is formed through the passivation layer 260 to expose the sacrificial layer 222 and the portions of the first conductive material layer 230, the sensor material layer 240 and the second conductive material layer 250 over the sacrificial layer 222.

Figure 8:
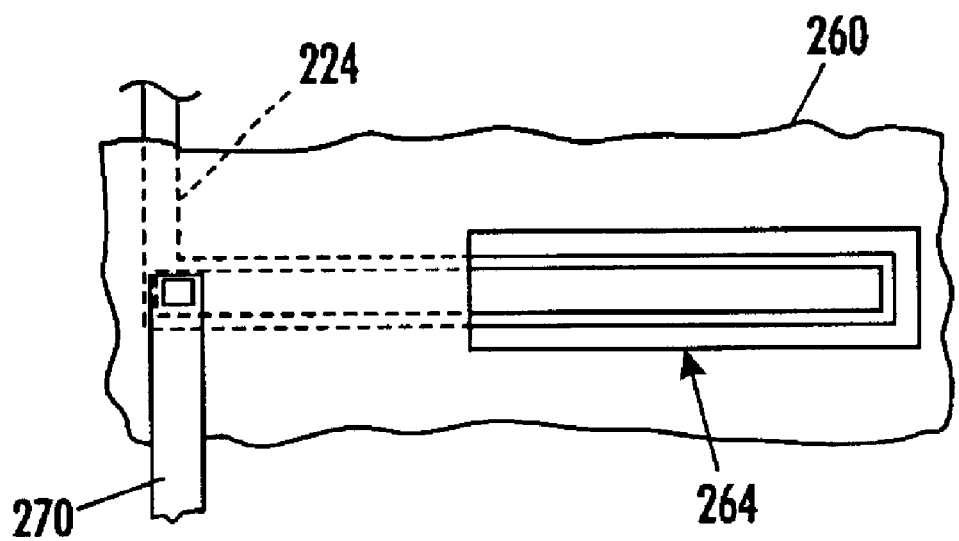
Figure 9:
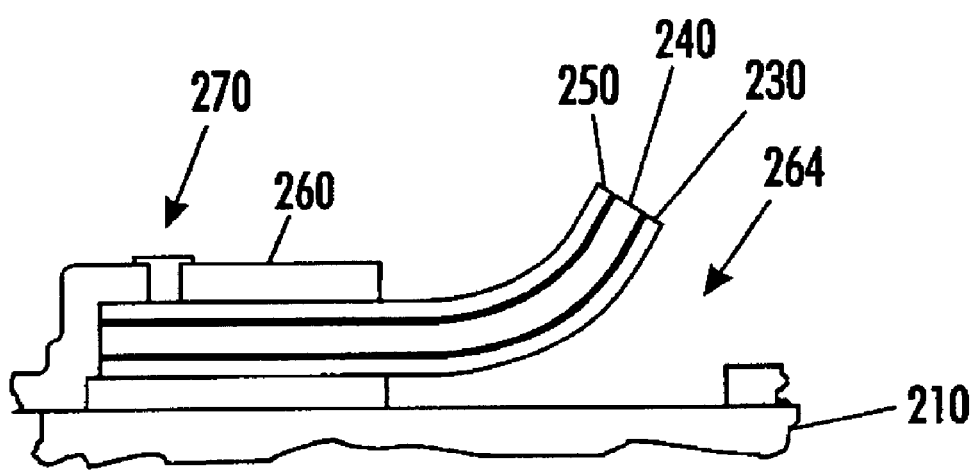

As illustrated in FIGS. 8 and 9, a contact 270 is formed, for example, by deposition and patterning, to contact the exposed portion of the second conductive material layer 250 through the via 262. The contact 270 may be of any suitable conductive material, such as chromium. Finally, the sacrificial layer 222 is removed, allowing the portions of the first conductive material layer 230, the sensor material layer 240 and the second conductive material layer 250 over the sacrificial layer 222 to curl away from the substrate 210 to relieve the intrinsic stress created by the stress gradient formed by the different stresses of the first conductive material layer 230, the sensor material layer 240 and the second conductive material layer 250. Thus, a sensor 200 is formed.

Figure 10:
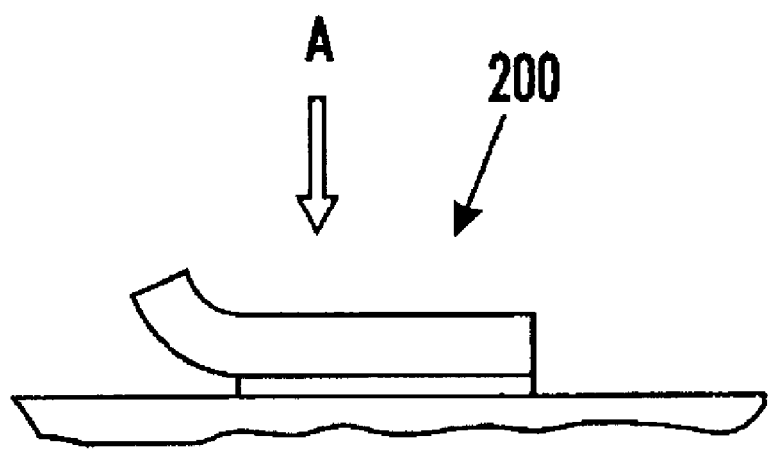
FIG. 10 illustrates an exemplary embodiment of a microelectromechanical system (MEMS) based sensor having a relatively low lift height according to this invention.
Figure 11:
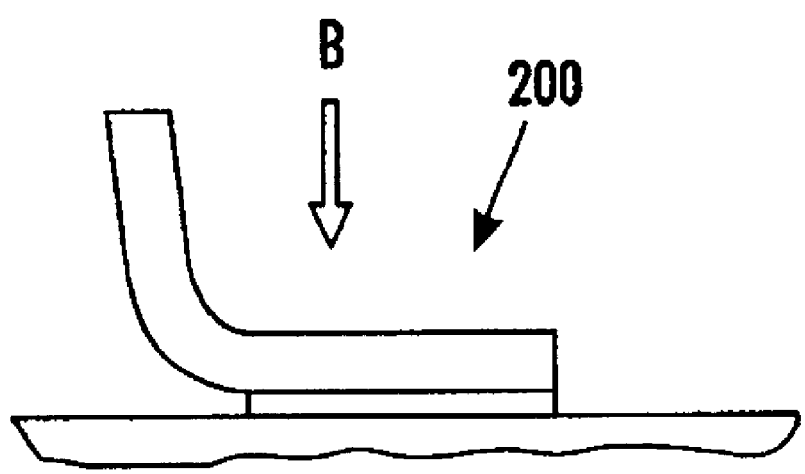
FIG. 11 illustrates an exemplary embodiment of a microelectromechanical system (MEMS) based sensor having a relatively high lift height according to this invention.

FIGS. 10 and 11 illustrate embodiments in which the sensor 200 is fabricated to have different lift heights. The lift height may be controlled by varying a release length of the sensor structure, i.e., the length of the sacrificial layer that is removed, or by varying the stress gradient. Thus, different lift heights can be readily created on a shared substrate.

In particular, the stress gradient may be enhanced by crystallizing a sub-layer of the sensor structure. For example, the sensor structure may be irradiated with a laser light before or after release. If, for example, the sensor material layer is a silicon layer, irradiation of the sensor material layer with laser light creates a polysilicon sub-layer adjacent to the second conductive material layer. The crystallized or polysilicon sub-layer has a reduced stress, e.g., a small compressive or tensile stress, thus enhancing the stress gradient of the sensor structure.

The amount of crystallization and the resulting reduction of stress in the sub-layer will vary with the amount of irradiation. For example, a higher fluence of laser irradiation will result in a greater amount of crystallization, a greater reduction of stress in the sub-layer and a greater enhancement of the stress gradient. For example, the source of laser irradiation may be a pulsed excimer laser with a pulse width of 20–50 ns and a wavelength of 150–400 nm.

In various exemplary embodiments of this invention, the laser light may be excimer laser light and the irradiation may be executed by pulsing the excimer laser light. Further, in various exemplary embodiments, the sensor material layer may be subjected to a recovery process to reduce photon-induced effects that may degrade the sensor. For example, the sensor may be subjected briefly to a conventional hydrogen plasma treatment at a low temperature after irradiation.

In the embodiment shown in FIG. 10, the release length of the sensor structure is relatively short and the lift height is relatively low. Also, as illustrated by arrow A, the relatively low lift height of the sensor may be achieved by irradiating the sensor structure with a relatively low fluence of laser light to enhance the stress gradient a relatively small degree.

In the embodiment shown in FIG. 11, the release length of the sensor structure is relatively long and the lift height is relatively high. Also, as illustrated by arrow B, the relatively high lift height of the sensor may be achieved by irradiating the sensor structure with a relatively high fluence of laser light to enhance the stress gradient a relatively large degree.

Figure 12:
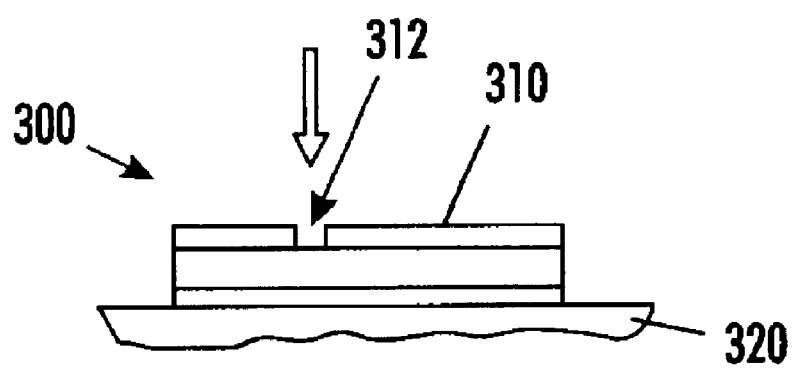
FIG. 12 illustrates an exemplary embodiment of a first method for laser enhancement of the stress gradient in a microelectromechanical system (MEMS) based sensor according to this invention.

FIG. 12 illustrates an exemplary embodiment of a first method for laser enhancement of the stress gradient in a microelectromechanical system (MEMS) based sensor according to this invention. According to this embodiment, only a portion of the sensor structure is exposed to the laser light. This approach limits any degradation of the sensor that may result from photon-induced defects, as compared to laser irradiation of the entire sensor structure to obtain a crystallized sub-layer as described above.

As shown in FIG. 12, a mask or light shield 310 is formed over a sensor 300 prior to irradiation. The mask 310 has at least one opening 312 that allows a desired portion of the sensor 300 to be irradiated by the laser light. The mask 310 may be made of any suitable material, either known or hereafter developed, that either reduces or prevents transmission of the laser light being used to irradiate the sensor 300.

Figure 13:
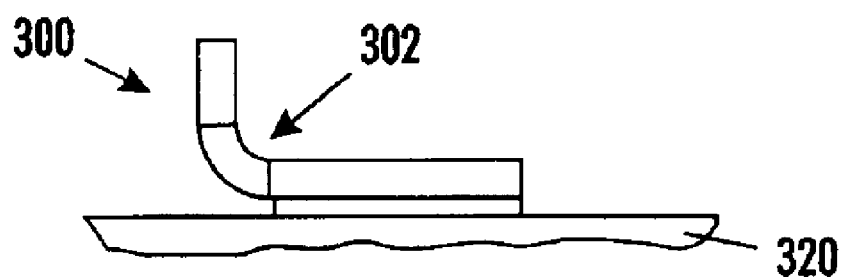
FIG. 13 illustrates an exemplary embodiment of a microelectromechanical system (MEMS) based sensor produced by the exemplary method of FIG. 12.

FIG. 13 illustrates an exemplary embodiment of the sensor 300 produced by the exemplary method of FIG. 12 after the sacrificial layer (not shown) has been removed. Upon release, the sensor 300 curls away from a substrate 320 on which the sensor 300 is formed. In particular, the sensor 300 bends at a segment 302 which was irradiated by the laser light to enhance the stress gradient. Because any degradation of the sensor 300 that may result from photon-induced defects is limited to the segment 302, the capability of the sensor 300 is improved.

Further, the sensor 300 may be fabricated to be capable of receiving signals from both sides. Since the sensing direction may be determined by the location of the transparent electrode, for example, the ITO layer, providing an ITO layer on each side of the sensor material layer of the sensor 300 allows the sensor 300 to sense from either direction upon release. As with the variability of lift height, this provides added flexibility in the design of the system.

Figure 14:
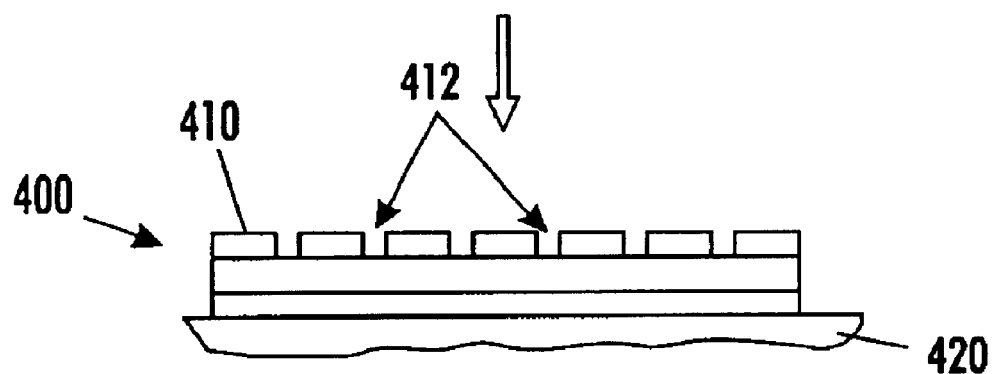
FIG. 14 illustrates an exemplary embodiment of a second method for laser enhancement of the stress gradient in a microelectromechanical system (MEMS) based sensor according to this invention.

FIG. 14 illustrates an exemplary embodiment of a second method for laser enhancement of the stress gradient in a microelectromechanical system (MEMS) based sensor according to this invention. According to this embodiment, only selected portions of the sensor structure are exposed to the laser light.

As shown in FIG. 14, a mask or light shield 410 is formed over a sensor 400 prior to irradiation. The mask 410 has at plurality of openings 412 that allows selected portions of the sensor 400 to be irradiated by the laser light. As described above, the mask 410 may be made of any suitable material, either known or hereafter developed, that either reduces or prevents transmission of the laser light being used to irradiate the sensor 400.

Figure 15:
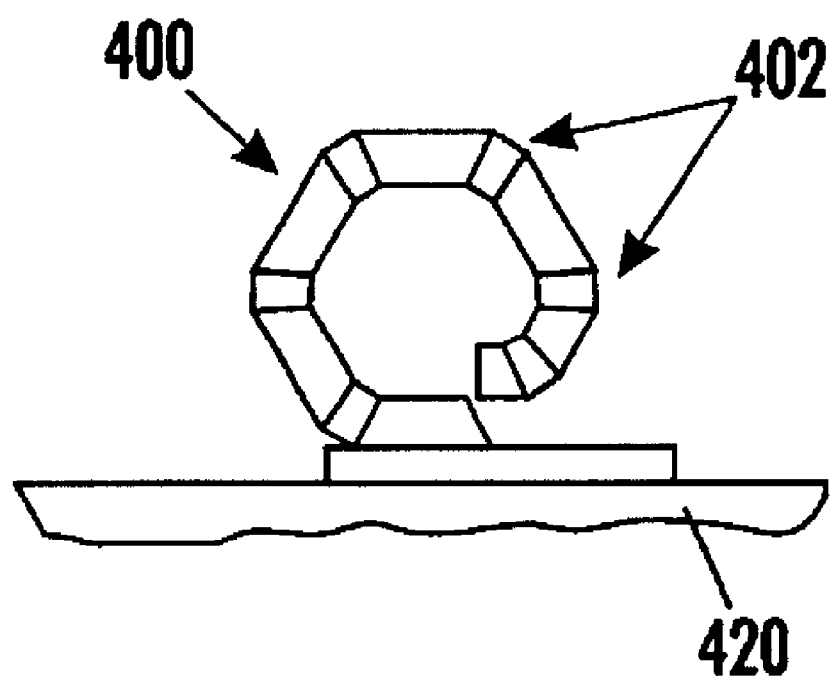
FIG. 15 illustrates an exemplary embodiment of a microelectromechanical system (MEMS) based sensor produced by the exemplary method of FIG. 14.

FIG. 15 illustrates an exemplary embodiment of the sensor 400 produced by the exemplary method of FIG. 14 after the sacrificial layer (not shown) has been removed. Upon release, the sensor 400 curls away from a substrate 420 on which the sensor 400 is formed. In particular, the sensor 400 bends at each segment.402 which was irradiated by the laser light to enhance the stress gradient. Thus, the sensor 400 may be fabricated to have various shapes, such as, for example, a coil shape as shown in FIG. 14.

Various bending angles of the irradiated segment or segments may be achieved by varying the amount of irradiation of the segment or segments. For example, localized attenuation of the laser light may be utilized.

Figure 16:
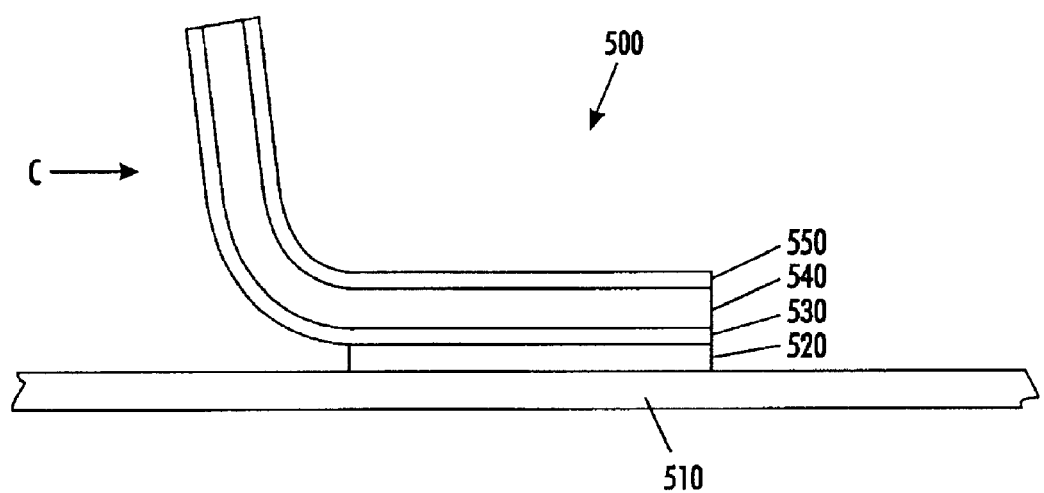
FIG. 16 is a cross sectional elevation view of a second exemplary embodiment of a microelectromechanical system (MEMS) based sensor according to this invention.

FIG. 16 shows a cross sectional view of a second exemplary embodiment of a microelectromechanical system (MEMS) based sensor 500 according to this invention. In this embodiment, an interconnect layer 520, such as aluminum, may be formed over a substrate 510. A first conductive material layer 530 comprising an ITO layer is formed over the interconnect layer 520. A sensor material layer 540, which may comprise p+, i and n+ amorphous silicon sub-layers, is formed over the first conductive material layer 530. A second conductive material layer 550 comprising a stressed metal layer, such as a tensile-stressed molybdenum-chromium layer, is formed over the sensor material layer 540. The sensor 500 according to this embodiment is able to receive a signal from the bending side, as illustrated by arrow C in FIG. 16.

Figure 17:
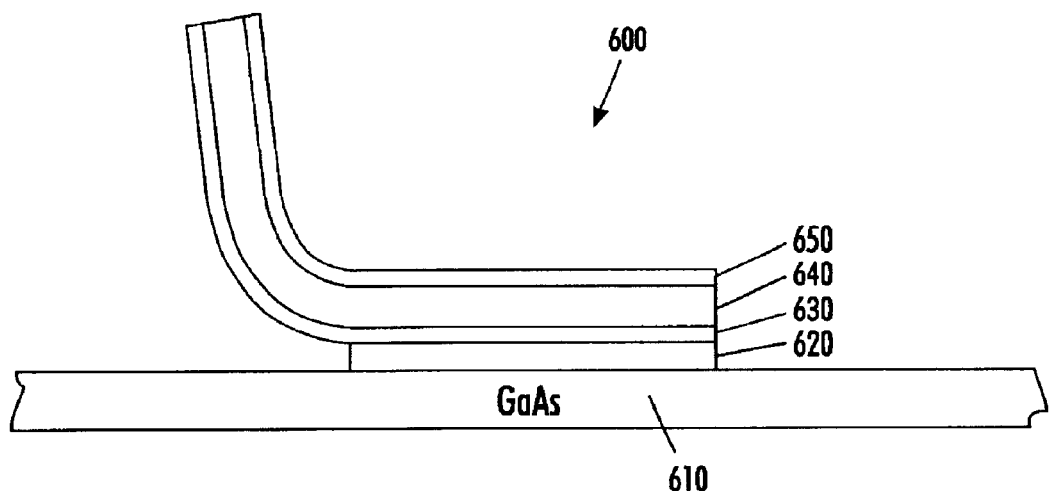
FIG. 17 is a cross sectional elevation view of a third exemplary embodiment of a microelectromechanical system (MEMS) based sensor according to this invention.

FIG. 17 shows a cross sectional view of a third exemplary embodiment of a microelectromechanical system (MEMS) based sensor 600 according to this invention. This embodiment illustrates that other sensing or optoelectronic materials, such as Group III-V semiconductors, may be used for the sensors according to this invention. In this embodiment, an interconnect layer 620, such as aluminum arsenide, may be formed over a substrate 610, such as a gallium arsenide substrate. A first conductive material layer 630 comprising an p+ gallium arsenide material, for example, is formed over the interconnect layer 620. A sensor material layer 640 of gallium arsenide, which may comprise i and n+ sub-layers, is formed over the first conductive material layer 630. A second conductive material layer 650 comprising a stressed metal layer, such as a tensile-stressed molybdenum-chromium layer, is formed over the sensor material layer 640. This embodiment may be utilized to provide high sensitivity and high speed signal detection.

Figure 19:
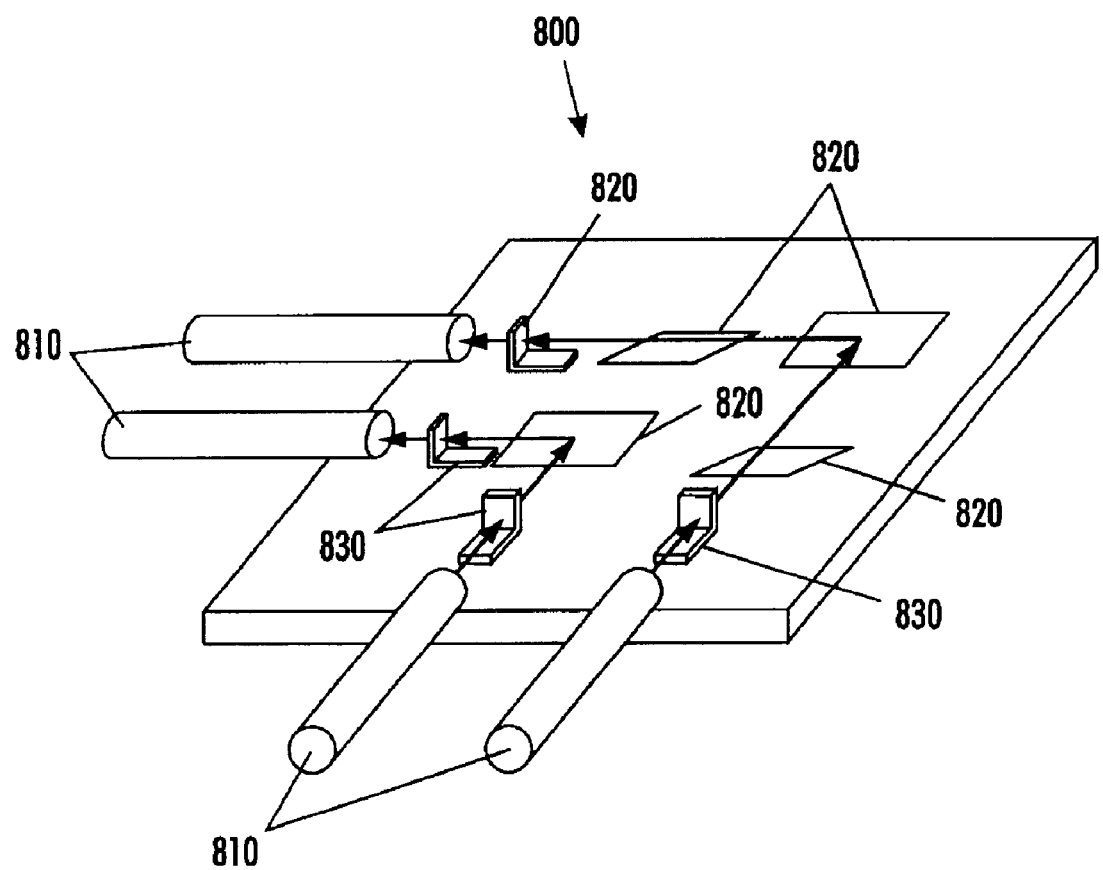
FIG. 19 is a schematic representation of an exemplary embodiment of an optical switching system including a plurality of microelectromechanical system (MEMS) based sensors according to this invention.
Figure 20:
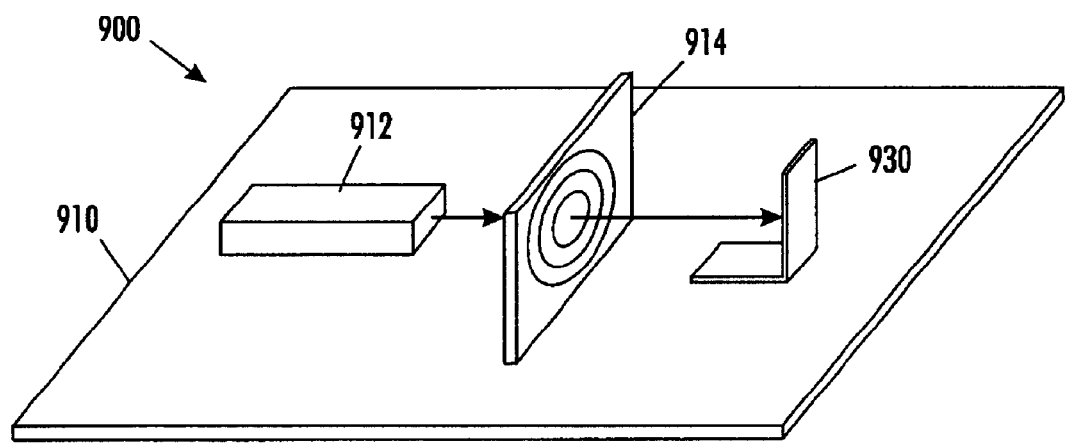
FIG. 20 is a schematic representation of an exemplary embodiment of a micro-optical bench integrated with a microelectromechanical system (MEMS) based sensor according to this invention.

As noted above, the microelectromechanical system (MEMS) based sensors according to this invention may be incorporated or integrated into a larger or composite system. For example, FIGS. 18, 19 and 20 illustrate exemplary embodiments in which sensors according to this invention are incorporated in a planar chip-to-chip communication system, an optical switching system and a micro-optical bench, respectively.

Figure 18:
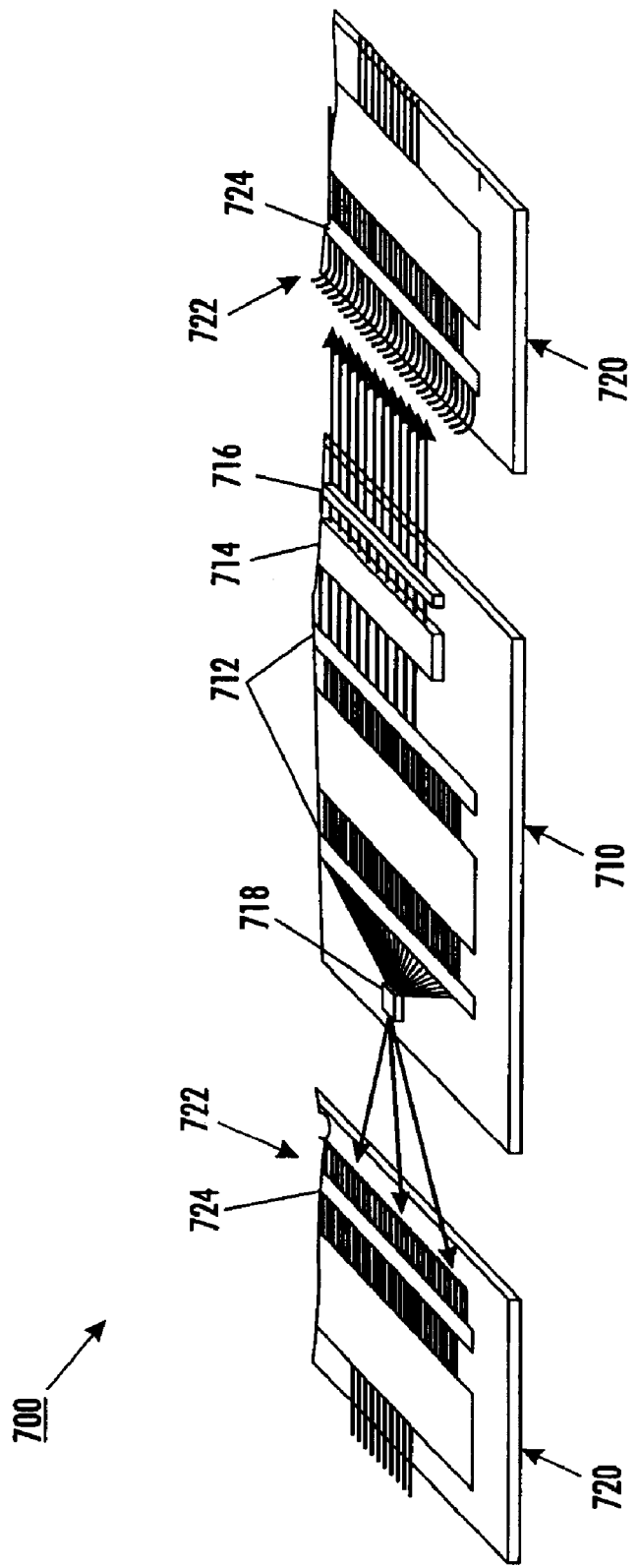
FIG. 18 is a schematic representation of an exemplary embodiment of a planar chip-to-chip optical communication system including a plurality of microelectromechanical system (MEMS) based sensors according to this invention.

An exemplary planar chip-to-chip communication system 700 is illustrated in FIG. 18. The communication system 700 comprises a master chip 710 and one or more slave chips 720. Each slave chip 720 may comprise memory and processor circuits along with at least one sensor, for example, an erected sensor array 722 and at least one sensor processor, for example, a plurality of CMOS sensor processors 724. The master chip 710 may comprise memory and processor circuits along with at least one transmitter driver 712 and at least one laser or LED, for example, a laser array 714, such as an edge emitting laser array or a VCSEL laser array. Optical signals from the laser array 714 may be collimated, for example, by an array of collimation lenses 716, to reduce cross-talk. Further, signals from a VCSEL laser array may be deflected and coupled into optical waveguides (not shown) which may be formed of dielectric or polymer materials on a substrate.

Alternatively or additionally to the laser array 714, the master chip 710 may comprise an optical scanner 718. Further, although not shown for the sake of simplicity, the master chip 710 may comprise one or more sensors or sensor arrays. This allows the master chip 710 to be optically linked to other master chips in addition to multiple slave chips 720, as illustrated.

Because the erected sensors may be fabricated using materials that involve a low temperature process, such as hydrogenated amorphous silicon, the sensors according to this invention may be fabricated on finished integrated circuit chips or on printed circuit boards. This allows for easy integration of sensors and chips and/or circuits.

In general, the master and slave chips of the communication system 700 may be mounted on a flat back plate or a printed circuit board. The mater chip 710 may be used to perform high-level information processing and to control task distribution. The slave chips 720 may be used to perform low-level processing and to provide input/output interfaces.

An example of an application of the planar optical communication system 700 is a flat panel display system. For a high-resolution display, there are thousands of gate lines and signal lines. An erected sensor may be fabricated for each gate line and each signal line. External driver chips may then send display signals via planar optical links.

An exemplary optical switching system 800 is illustrated in FIG. 19. The switching system 800 comprises a plurality of optical fibers 810, a switching array, for example, a switching mirror array 820, and a plurality of erected sensors 830. One of the erected sensors 830 is associated with each of the optical fibers 810 and positioned to absorb a small fraction of the light signal in each optical path. The erected sensors 830 may be easily integrated into the optical switching system 800 with a low manufacturing cost.

The signals generated in the sensors 830 may be used to monitor optical power and traffic flow. Further, the erected sensors 830 may be used for in-line calibration of the optical switching system 800. Based on the status of the mirrors of the switching mirror array 820, the sensors can send signal intensities to driver electronics (not shown) for calibration. Alternatively or additionally, the mirrors of the switching mirror array 820 may be controlled based on signals sent to the driver electronics from the sensors 830.

An exemplary micro-optical bench 900 is illustrated in FIG. 20. The micro-optical bench 900 comprises a bench 910 on which a plurality of optical components, for example, a laser 912 and a Fresnel lens 914 are integrated. At least one erected sensor 930 is integrated onto the bench 910. The erected sensor 930 replaces conventional photo detectors which are bonded to an optical bench. Because the erected sensor 930 is integrated on the bench 910, optical alignment is simplified. Further, since the other optical components such as the laser 912 and the Fresnel lens 914 may be integrated on the bench 910 using known techniques, the micro-optical bench 900 may be substantially monolithically fabricated.

While this invention has been described in conjunction with various exemplary embodiments, it is to be understood that many alternatives, modifications and variations would be apparent to those skilled in the art. Accordingly, Applicants intend to embrace all such alternatives, modifications and variation that follow in the spirit and scope of this invention.

What is claimed is:

1. A microelectromechanical system (MEMS) based sensor, comprising:
    a substrate defining a plane;
    a first conductive material layer having a first stress, a first portion of the first conductive material layer being connected to the substrate and extending in a substantially parallel direction to the plane defined by the substrate, a second portion of the first conductive material layer being disconnected from the substrate and extending in a substantially non-parallel direction to the plane defined by the substrate; and
    a sensor formed over at least the second portion of the first conductive material layer, the sensor comprising a sensor material layer having a second stress that is less than the first stress of the first conductive material layer, wherein the first and second stresses form a stress gradient that bends the second portion of the first conductive material layer and the sensor material layer formed over the second portion of the first conductive material layer away from the substrate.

2. The sensor of claim 1, further comprising a second conductive material layer formed over the sensor material layer, the second conductive material layer having a third stress that is less than the second stress of the sensor material layer, the first, second and, third stresses forming a stress gradient that bends the second portion of the first conductive material layer, the sensor material layer formed over the second portion of the first conductive material layer and at least a portion of the second conductive material layer away from the substrate.

3. The sensor of claim 2, wherein the first and second stresses are compressive stresses and the third stress is a tensile stress.

4. The sensor of claim 2, wherein the second conductive material layer comprises molybdenum-chromium.

5. The sensor of claim 1, wherein the sensor material layer comprises a silicon material.

6. The sensor of claim 5, wherein the silicon material comprises amorphous silicon.

7. The sensor of claim 6, wherein the amorphous silicon comprises hydrogenated amorphous silicon.

8. The sensor of claim 1, wherein the sensor material layer comprises a Group III-V semiconductor material.

9. The sensor of claim 8, wherein the Group III-V semiconductor material comprises gallium-arsenide.

10. The sensor of claim 1, wherein the first conductive material layer comprises a titanium-tungsten material.

11. The sensor of claim 1, wherein the first and second stresses are compressive stresses.

12. The sensor of claim 1, wherein at least a partial sub-layer of the sensor material layer that is remote from the first conductive material layer has a reduced stress that is less than the second stress.

13. A chip-to-chip communication system, comprising:
    a first semiconductor chip having at least one of an optical scanner and a laser array; and
    a second semiconductor chip having an array of microelectromechanical system based sensors of claim 1,
    wherein the array of sensors is aligned with the at least one of the optical scanner and the laser array.

14. The system of claim 13, further comprising a back plate having a planar surface on which the first and second semiconductor chips are mounted.

15. The system of claim 14, wherein the back plate comprises a printed circuit board.

16. The system of claim 13, wherein the first semiconductor chip has a laser array and a collimation lens array associated with the laser array.

17. The system of claim 13, wherein the first semiconductor chip has a laser array comprising an edge emitting laser array.

18. The system of claim 13, wherein the first semiconductor chip has a laser array comprising an VCSEL laser array.

19. The system of claim 13, wherein the first semiconductor chip and the second semiconductor chip are part of a flat panel display system.

20. A method of in-line calibration of an optical link, comprising:
    disposing a microelectromechanical system based sensor of claim 1 in an optical path of an optical signal carrier; and
    sensing at least a portion of an optical signal carried by the optical signal carrier.

21. The sensor of claim 1, wherein the sensor material layer comprises a different material than the first conductive material layer.

22. A method of fabricating a microelectromechanical system (MEMS) based sensor, comprising:
   forming a substrate that defines a plane;
   forming a first conductive material layer having a first stress, at least a first portion of the first conductive material layer being connected to the substrate and extending in a substantially parallel direction to the plane defined by the substrate;
   forming a sensor over at least a second portion of the first conductive material layer, the sensor comprising a sensor material layer having a second stress that is less than the first stress of the first conductive material layer; and
   disconnecting the second portion of the first conductive material layer from the substrate after forming the sensor,
   wherein the first and second stresses form a stress gradient that bends the second portion of the first conductive material layer and the sensor material layer formed over the second portion of the first conductive material layer away from the substrate to extend in a substantially non-parallel direction to the plane defined by the substrate upon disconnection of the second portion from the substrate.

23. The method of claim 22, further comprising forming a second conductive material layer over the sensor material layer, the second conductive material layer having a third stress that is less than the second stress of the sensor material layer, the first, second and, third stresses forming a stress gradient that bends the second portion of the first. conductive material layer, the sensor material layer formed over the second portion of the first conductive material layer and at least a portion of the second conductive material layer away from the substrate.

24. The method of claim 23, wherein forming the first conductive material layer and forming the sensor material layer comprise forming layers having compressive stresses and forming the second conductive material layer comprises forming a layer having a tensile stress.

25. The method of claim 23, wherein forming the second conductive material layer comprises forming a molybdenum-chromium layer.

26. The method of claim 22, wherein forming the sensor material layer comprises forming a silicon material layer.

27. The method of claim 26, wherein forming the silicon material layer comprises forming an amorphous silicon layer.

28. The method of claim 27, wherein forming the amorphous silicon layer comprises forming a hydrogenated amorphous silicon layer.

29. The method of claim 22, wherein forming the sensor material layer comprises forming a Group III-V semiconductor material layer.

30. The method of claim 29, wherein forming the Group III-V semiconductor material layer comprises forming a gallium-arsenide layer.

31. The method of claim 22, wherein forming the first conductive material layer comprises forming a titanium-tungsten material layer.

32. The method of claim 22, wherein forming the first conductive material layer and forming the sensor material layer comprise forming layers having compressive stresses.

33. The method of claim 22, further comprising forming at least a partial reduced-stress sub-layer of the sensor material layer remote from the first conductive material layer, the at least partial reduced stress sub-layer having a stress that is less than the second stress.

34. The method of claim 33, wherein forming the at least partial reduced-stress sub-layer comprises irradiating part of the sensor material layer with laser light.

35. The method of claim 34, further comprising subjecting the sensor material layer to a hydrogen plasma treatment after irradiating part of the sensor material layer with laser light.

36. The method of claim 34, wherein irradiating part of the sensor material layer with laser light comprises irradiating with excimer laser light.

37. The method of claim 36, wherein irradiating with excimer laser light comprises pulsing the excimer laser light.

38. The method of claim 22, wherein the sensor material layer comprises a different material than the first conductive material layer.

39. A method of fabricating a microelectromechanical system (MEMS) based sensor, comprising:
   forming a substrate that defines a plane;
   forming a first conductive material layer having a first stress, at least a first portion of the first conductive material layer being connected to the substrate and extending in a substantially parallel direction to the plane defined by the substrate;
   forming a sensor material layer over at least a second portion of the first conductive material layer, the sensor material layer having a second stress that is less than the first stress of the first conductive material layer;
   forming at least a partial reduced-stress sub-layer of the sensor material layer remote from the first conductive material layer, the at least partial reduced stress sub-layer having a stress that is less than the second stress, wherein forming the at least partial reduced-stress sub-layer comprises crystallizing part of the sensor material layer; and
   disconnecting the second portion of the first conductive material layer from the substrate,
   wherein the first and second stresses form a stress gradient that bends the second portion of the first conductive material layer and the sensor material layer formed over the second portion of the first conductive material layer away from the substrate to extend in a substantially non-parallel direction to the plane defined by the substrate upon disconnection of the second portion from the substrate.

40. The method of claim 39, further comprising subjecting the sensor material layer to a hydrogen plasma treatment after crystallizing part of the sensor material layer.

41. The method of claim 39, wherein forming the sensor material layer comprises forming a silicon layer and crystallizing part of the sensor material layer comprises forming at least a partial polysilicon layer.

42. A chip-to-chip communication method, comprising:
   emitting an optical signal from a first semiconductor chip using at least one of an optical scanner and a laser array; and
   receiving the emitted optical signal at a second semiconductor chip using an array of microelectromechanical system based sensors that is aligned with the at least one of the optical scanner and the laser array,
   wherein each microelectromechanical system based sensor of the array comprises:
      a substrate defining a plane;
      a first conductive material layer having a first stress, a first portion of the first conductive material layer being connected to the substrate and extending in a substantially parallel direction to the plane defined by the substrate, a second portion of the first conductive material layer being disconnected from the substrate and extending in a substantially non-parallel direction to the plane defined by the substrate; and a sensor material layer formed over at least the second portion of the first conductive material layer, the sensor material layer having a second stress that is less than the first stress of the first conductive material layer, wherein the first and second stresses form a stress gradient that bends the second portion of the first conductive material layer and the sensor material layer formed over the second portion of the first conductive material layer away from the substrate.

43. A micro-optical bench, comprising:

a bench surface; and at least one microelectromechanical system based sensor integrated with the bench surface, wherein the at least one microelectromechanical system based sensor comprises:

a substrate defining a plane;

a first conductive material layer having a first stress, a first portion of the first conductive material layer being connected to the substrate and extending in a substantially parallel direction to the plane defined by the substrate, a second portion of the first conductive material layer being disconnected from the substrate and extending in a substantially non-parallel direction to the plane defined by the substrate; and a sensor material layer formed over at least the second portion of the first conductive material layer, the sensor material layer having a second stress that is less than the first stress of the first conductive material layer, wherein the first and second stresses form a stress gradient that bends the second portion of the first conductive material layer and the sensor material layer formed over the second portion of the first conductive material layer away from the substrate.

* * * * *